United States Patent [19]
Lin et al.

[11] Patent Number: 6,063,653
[45] Date of Patent: May 16, 2000

[54] METHOD OF FABRICATING A TFT-LCD

[75] Inventors: Kang-Cheng Lin, Taipei; Gwo-Long Lin, Hsinchu, both of Taiwan

[73] Assignee: Industrial Technology Research Institute, Hsinchu Hsien, Taiwan

[21] Appl. No.: 09/111,279

[22] Filed: Jul. 7, 1998

[51] Int. Cl.[7] .................................................. H01L 21/84
[52] U.S. Cl. .......................................... 438/160; 438/164
[58] Field of Search ..................................... 438/149, 151, 438/158, 159, 160, 161, 164; 257/57, 59, 66; 156/661.1

[56] References Cited

U.S. PATENT DOCUMENTS

| | | | |
|---|---|---|---|
| 4,284,468 | 8/1981 | Stearns | 156/661.1 |
| 5,010,027 | 4/1991 | Possin et al. | |
| 5,166,086 | 11/1992 | Takeda et al. | |
| 5,429,962 | 7/1995 | Yang | 438/151 |
| 5,610,082 | 3/1997 | Oh | 438/160 |
| 5,834,797 | 11/1998 | Yamanaka | 257/57 |

*Primary Examiner*—Donald L. Monin, Jr.
*Assistant Examiner*—Anh Duy Mai
*Attorney, Agent, or Firm*—McDermott, Will & Emery

[57] ABSTRACT

The present invention includes patterning a metal layer on a glass substrate. A dielectric layer is formed on the metal layer. An amorphous silicon layer is subsequently formed on the dielectric layer. A first positive photoresist is formed on the amorphous silicon layer. Then, a back-side exposure is used by using the gate electrodes as a mask. A bake step is performed to expand the lower portion of the photoresist. Next, a second positive photoresist layer is formed on the amorphous silicon layer and the residual first positive photoresist layer. A further back-side exposure is employed again from the back side of the substrate using the gate electrode as the mask. A second back step is applied to expand the lower portion of the second positive photoresist layer. An ion implantation is performed by using the second positive photoresist as a mask. Next, the substrate is then annealed. Amorphous silicon layer is then patterned. A further dielectric layer for isolation is formed on the patterned amorphous silicon layer. Source and drain are patterned on the dielectric layer to contact with the amorphous silicon layer. Subsequently, a passivation layer is deposited on the source and drain.

16 Claims, 7 Drawing Sheets

METHOD OF FABRICATING A TFT-LCD

FIELD OF THE INVENTION

The present invention relates to a method of making thin film transistors, and more specifically, to a method of forming a thin film transistor-liquid crystal displays.

BACKGROUND OF THE INVENTION

Thin film transistor-liquid crystal display (TFT-LCD) is known as the display required for the high pixel density and quality. In general, the TFT-LCD includes a bottom plate formed with thin film transistors and pixel electrodes and a top plate formed with color filters. The liquid crystal is filled between the top plate and the bottom plate. In each unit pixel, a capacitor and a further capacitor are provided which are formed by virtue of the TFT serving as the switching element of the unit pixel. In the operation, a gate signal voltage is applied to the TFT that is the switching element of each unit pixel. The TFT receives the gate signal voltage, it is turn on so that data voltage carrying image information can be applied to the corresponding pixel electrode and the liquid crystal via the TFT. When the data voltage is applied to the TFT, the arrangement of the liquid crystal moleculers is change, thereby changing the optical properties and displaying the image. Supplying of voltage to each pixel electrode is carried out via a single line by a corresponding thin film transistor which is switched by a gate voltage supplied via a gate bus line.

In U.S. Pat. No. 5,166,086 proposed by Takeda et al., he disclosed a method to form a TFT-LCD. In the patent, Takeda provides a TFT array with reduced parastic capacitances. Further, Possin et al. disclosed a method to form a TFT-LCD by using back-side photoresist exposure. Please refer to U.S. Pat. No. 5,010,027. Possin teaches a method for forming a self-aligned thin-film transistor which controls the overlap width of the gate electrode with each source and drain electrode to an optimum distance.

Typically, the channel region of the self-aligned TFT-LCD is defined by the gate structure as a mask. The lightly doped drain (LDD) region or the offset structure is formed by a further photomask. The object of the present invention is to provide a method to form the offset structure without a further photomask as aforesaid.

SUMMARY OF THE INVENTION

The present is to form a TFT-LCD having a offset structure. The present invention includes patterning a metal layer on a glass substrate for serving as the gate electrode. The metal layer can be chosen from the group of chromium (Cr), tungsten (W), titanium (Ti), tantalum (Ta) or molybdenum (Mo). Next, a dielectric layer is formed on the gate for isolation. An amorphous silicon layer having hydrogen ions (a-Si:H) is subsequently formed on the dielectric layer. A first positive photoresist is formed on the amorphous silicon layer. Then, a back-side exposure is used using the gate electrodes as a mask. A bake step is performed at a temperature 140 to 150 degrees centigrade for about 20 to 30 minutes to expand the lower portion of the photoresist. Next, a second positive photoresist layer is formed on the amorphous silicon layer and the residual first positive photoresist layer.

A further back-side exposure is employed again from the back side of the substrate using the gate electrode as the mask. A second back step is applied to expand the lower portion of the second positive photoresist layer. An ion implantation with phosphorus ions is performed by using the second positive photoresist as a mask to implant heavily ions into the amorphous silicon layer. In addition, the step to form the doped region can be in lieu of a plasma treatment with $PH_3$. Then, the first and second positive photoresist layer are stripped by conventional way. Next, the substrate is then annealed at a temperature at 380 to 420 degrees centigrade. Then, the substrate is optionally annealed by an Excimer laser annealing.

Amorphous silicon layer is patterned. A further dielectric layer for isolation is formed on the patterned amorphous silicon layer. Via holes are created by etching to expose a portion of the amorphous silicon layer. Next, a conductive layer is patterned on the dielectric layer to contact with the doped regions of the amorphous silicon layer. Subsequently, a passivation layer formed of silicon nitride layer is deposited on the source and drain.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed to form a TFT-LCD. The present invention provides a method to form a TFT-LCD having a offset structure. Back-side exposure technique is used to eliminate the misalignment induced by the photolithography process. Further, at least two photoresist layers are used to construct the offset structure. As will be seen below, this technique can be used for the formation of a TFT device.

Figure 1:
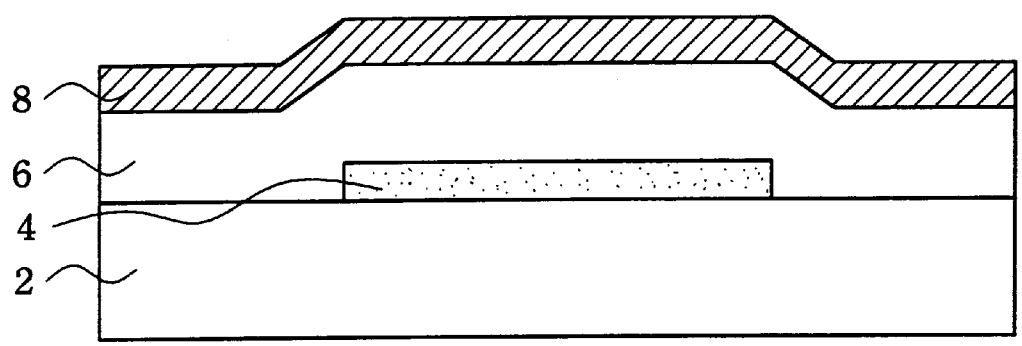
FIGS. 1 is a cross sectional view of a substrate illustrating the steps of forming gate, gate insulating layer and amorphous silicon layer in accordance with the present invention.

Referring to FIG. 1, in the preferred embodiment, a glass substrate 2 or the like is used as an insulating transparent substrate. In a preferred embodiment, the substrate 2 is chosen from glass or quartz. Subsequently, still referring to FIG. 1, a metal layer 4 for the gate electrode is formed by using physical vapor deposition (PVD). The metal layer 4 can be chosen from the group of chromium (Cr), tungsten (W), titanium (Ti), tantalum (Ta) or molybdenum (Mo). A Cr/Al (chromium/aluminum) composition layer can also be used for serving as the gate electrode 4. The metal layer 4 is then patterned on the substrate 2. The thickness of the metal layer 4 is approximately 1500–3000 angstroms. Next, a gate isolation (dielectric) layer 6 is formed on the gate 4 for isolation. An amorphous silicon layer 8 (a-Si:H) is subsequently formed on the gate isolation layer 6. In a case, the amorphous silicon layer 8 is about 300 to 600 angstroms in thickness.

Figure 2:
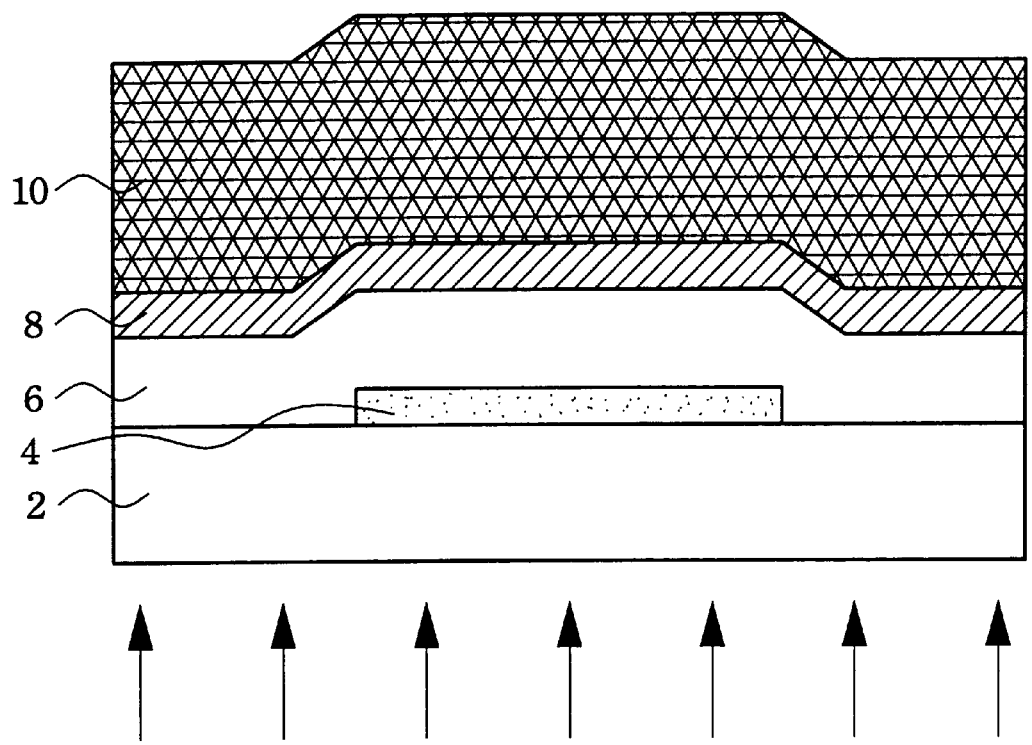
FIG. 2 is a cross sectional view of a semiconductor wafer illustrating the step of forming a first positive photoresist in accordance with the present invention.
Figure 3:
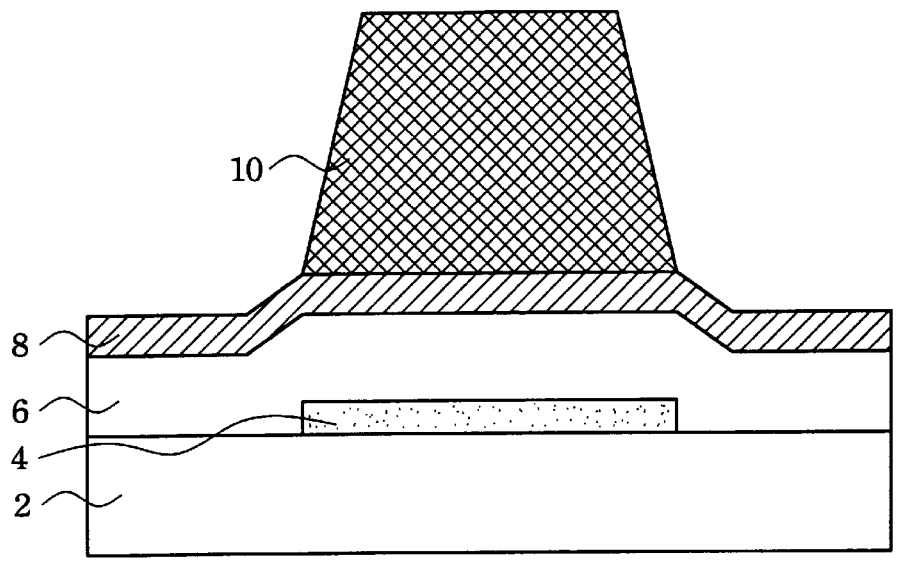
FIG. 3 is a cross sectional view of a semiconductor wafer illustrating the step of patterning the first positive photoresist in accordance with the present invention.
Figure 4:
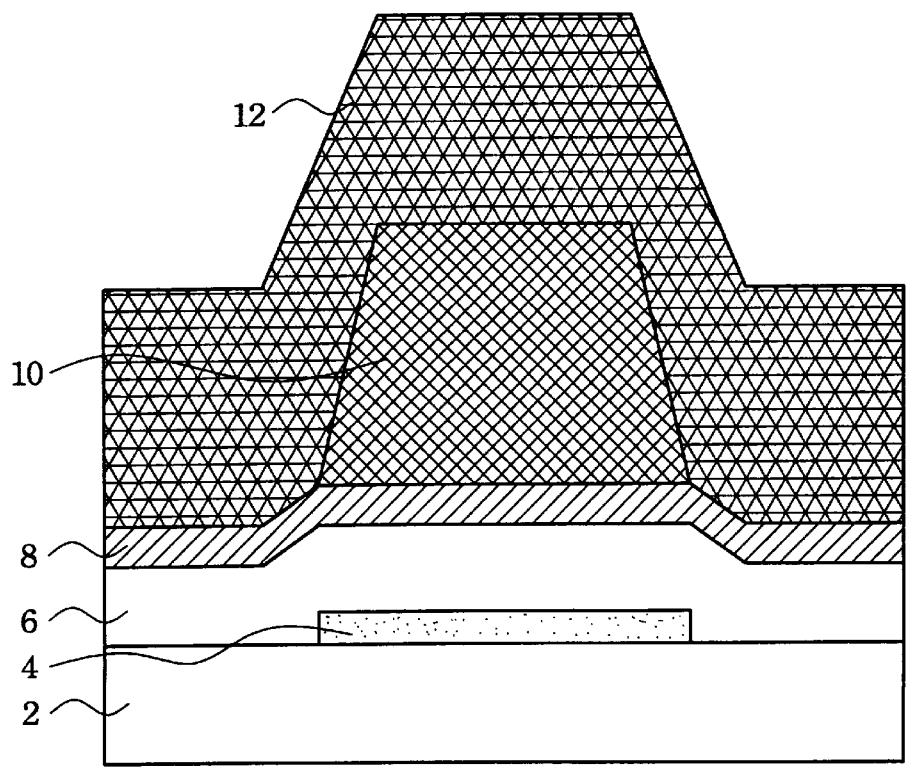
FIG. 4 is a cross sectional view of a semiconductor wafer illustrating the step of forming a second positive photoresist in accordance with the present invention.

Turning to FIG. 2, a first positive photoresist 10 is formed on amorphous silicon layer 8. Then, a back-side exposure indicated by arrows is introduced using the gate electrodes 4 as a mask. The exposed portion of the first positive photoresist 10 is removed. Thus, only the portion over the gate electrode 4 is left, as shown in FIG. 3. After that, a bake step is performed at a temperature 140 to 160 degrees centigrade for about 20 to 30 minutes in forming gas such as $N_2$. Therefore, the profile of the first positive photoresist become oblique due to the thermal process and the lower portion of the photoresist 10 is expanded. Next, turning to FIG. 4, a second positive photoresist layer 12 is formed on the amorphous silicon layer 8 and the residual first positive photoresist layer 10.

Figure 5:
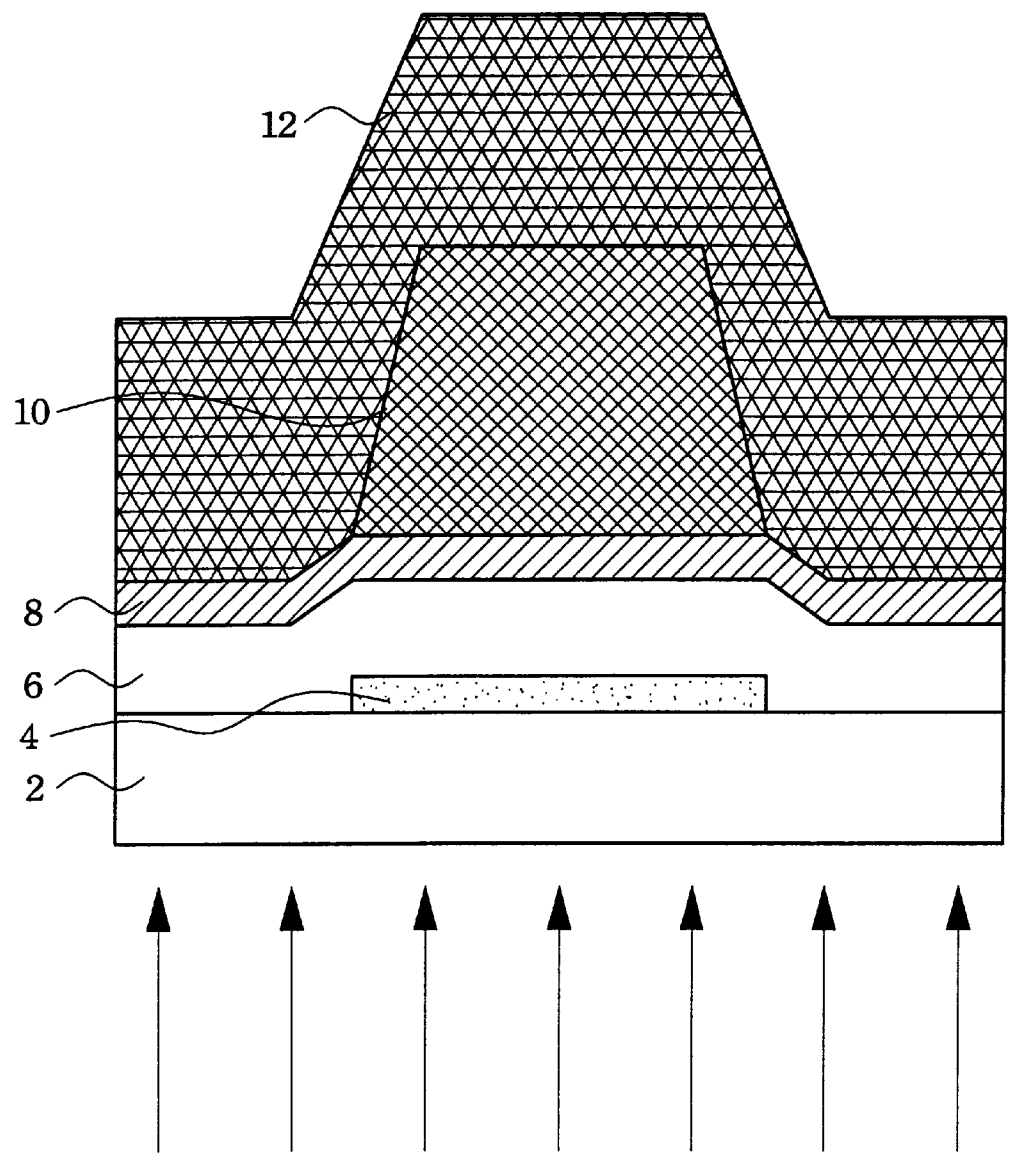
FIG. 5 is a cross sectional view of a semiconductor wafer illustrating the step of exposing a second photoresist in accordance with the present invention.
Figure 6:
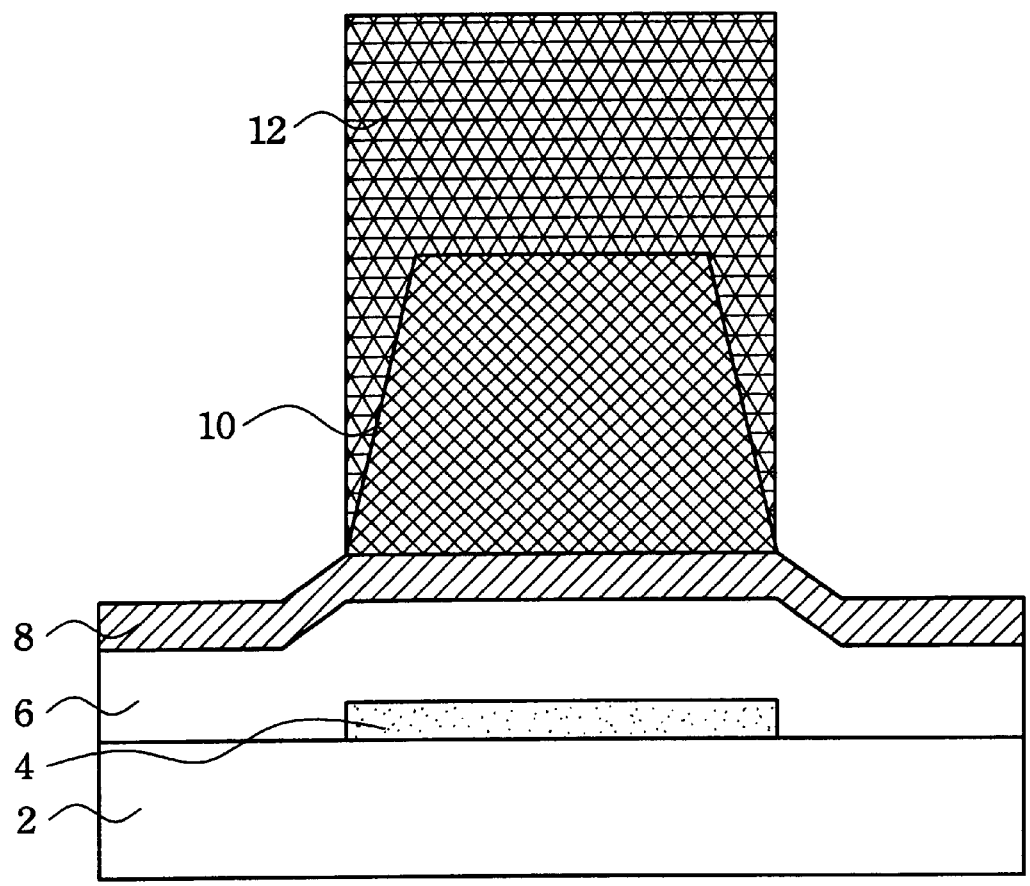
FIG. 6 is a cross sectional view of a semiconductor wafer illustrating the step of patterning second positive photoresist in accordance with the present invention.
Figure 7:
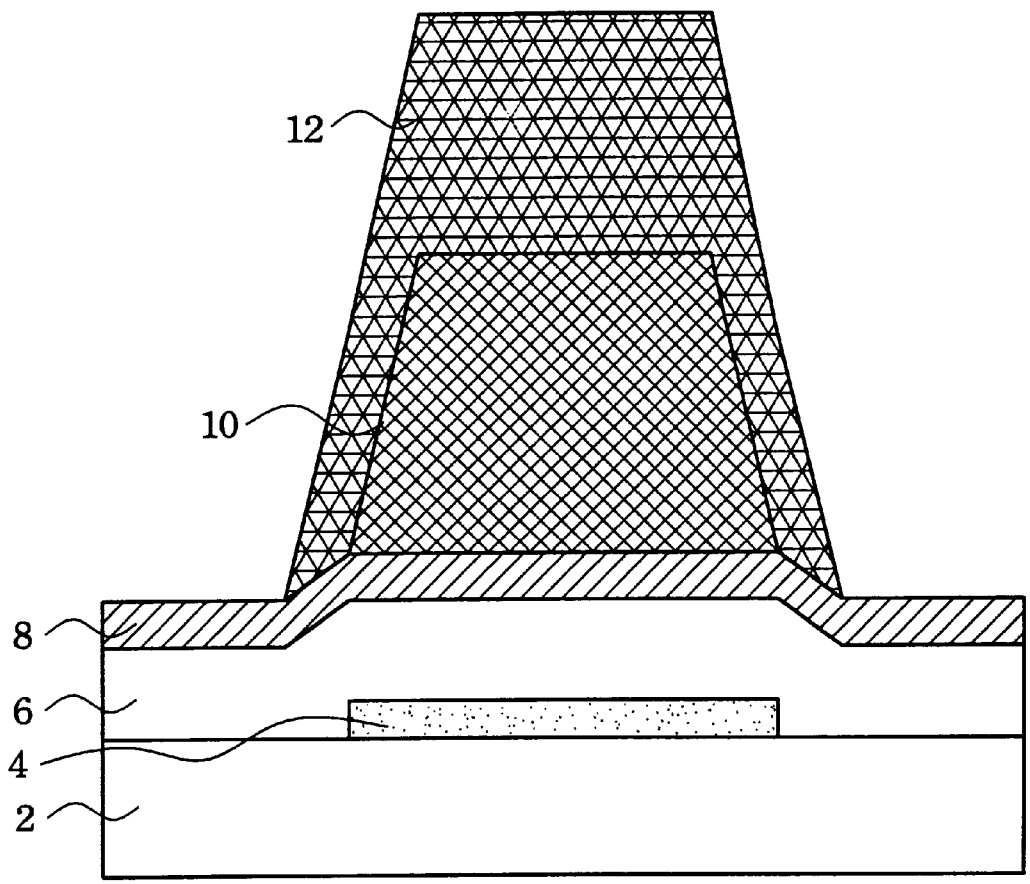
FIG. 7 is a cross sectional view of a semiconductor wafer illustrating the step of backing the second positive photoresist layer in accordance with the present invention.

Referring to FIG. 5, a further back-side exposure is employed again from the back side of the substrate 2 indicated by the arrows. The gate electrode also acts as the mask in the step. Similarly, the exposed portion will be stripped by conventional manner, only the portion of the gate remains over the gate 4, as shown in the FIG. 6. Turning to FIG. 7, A second back step is applied to re-flow the second positive photoresist layer 12, thereby expanding the lower portion of the second positive photoresist layer 12. The second positive photoresist layer 12 has an oblique surface. In the preferred embodiment, the substrate 2 is annealed in a furnace at a temperature about 140 to 160 degrees centigrade for about 15 to 20 minutes in forming gas.

Figure 8:
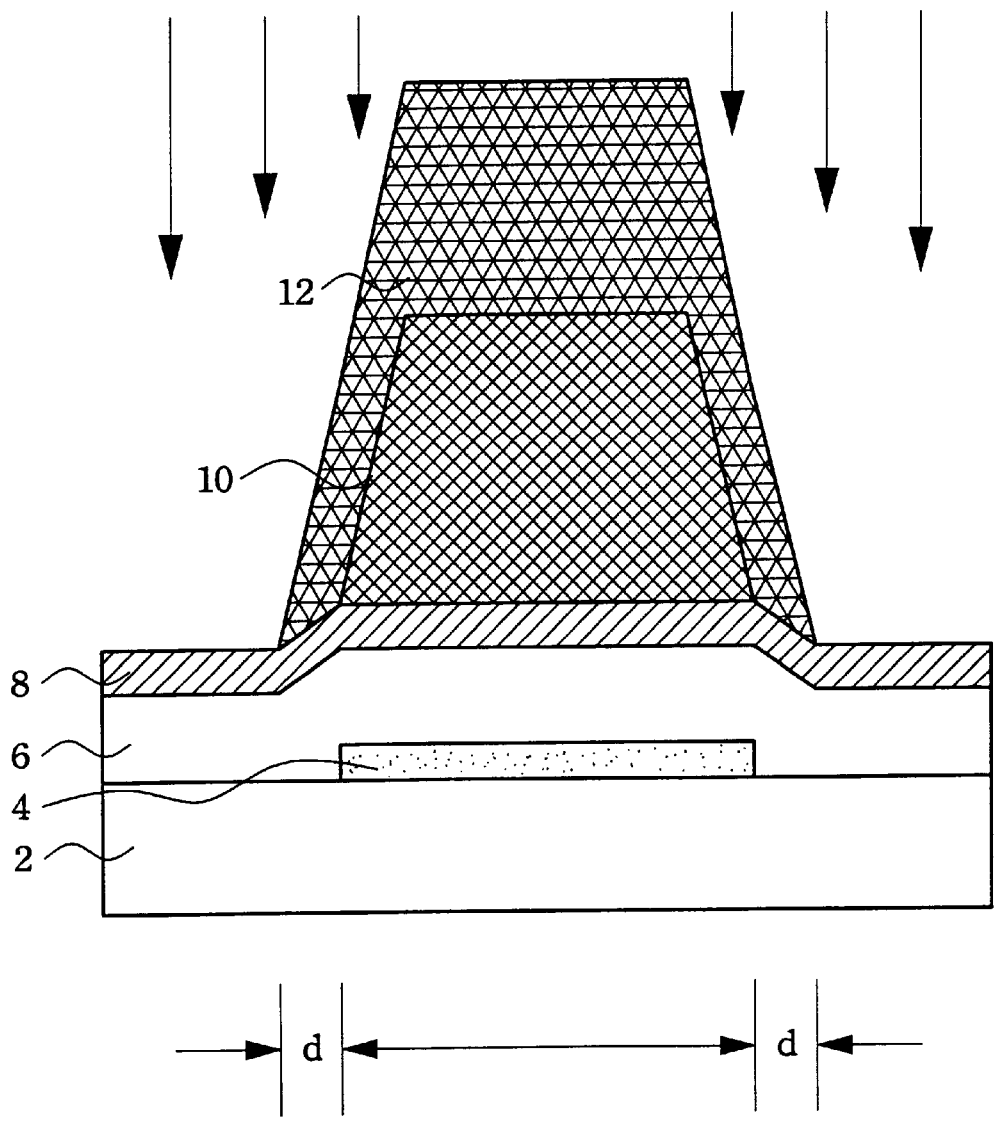
FIG. 8 is a cross sectional view of a semiconductor wafer illustrating the step of doping ions into the amorphous silicon layer in accordance with the present invention.

Turning to FIG. 8, an ion implantation with phosphorus ions is performed by using the second positive photoresist 12 as a mask to implant heavily ions into the amorphous silicon layer 8. In addition, the step to form the doped region can be in lieu of a plasma treatment with $PH_3$. As shown in the FIG. 8, offset regions indicated by "d" are formed in the amorphous silicon layer 8 due to the lower portion of the second positive photoresist is expanded. It means that the doped regions in the amorphous silicon layer 8 will not overlap with the gate electrode 4 but keep a distant "d" from the gate electrode 4.

Figure 9:
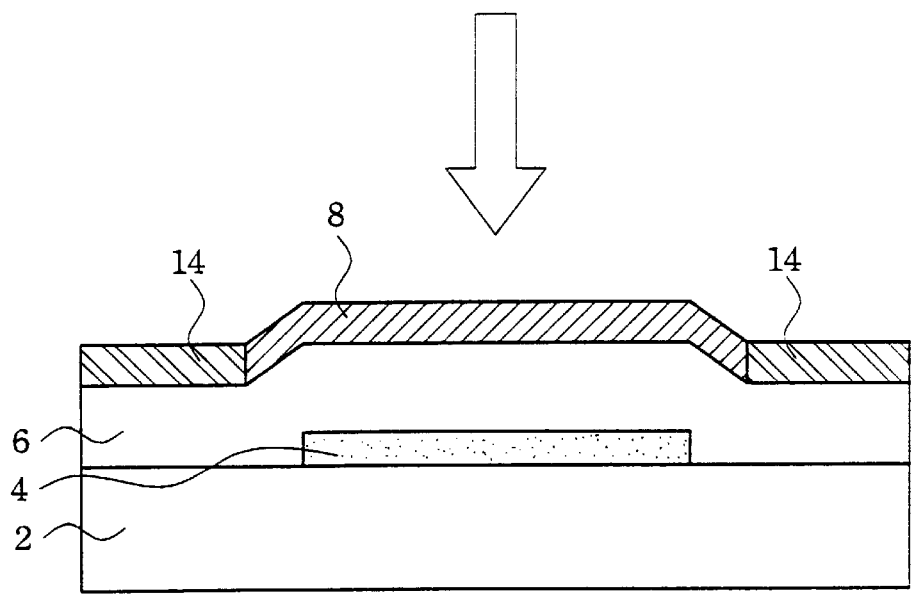
FIG. 9 is a cross sectional view of a semiconductor wafer illustrating the step of annealing the substrate in accordance with the present invention.

Referring to FIG. 9, the substrate 2 is then loaded into a furnace, and is annealed at a temperature at 380 to 420 degrees centigrade for about 90 to 180 minutes. Then, the substrate 2 is optionally annealed by an Excimer laser annealing. For example, it can be done by XeCl Excimer laser. The wavelength of the laser is 308 nm. Other suitable laser can also be used. Finally, the doped regions 14 are created. As known in the art, metal silicide can be optionally formed on the doped regions 14 to reduce resistance. Then, the first and second positive photoresist layer 10, 12 are stripped by conventional way.

Figure 10:
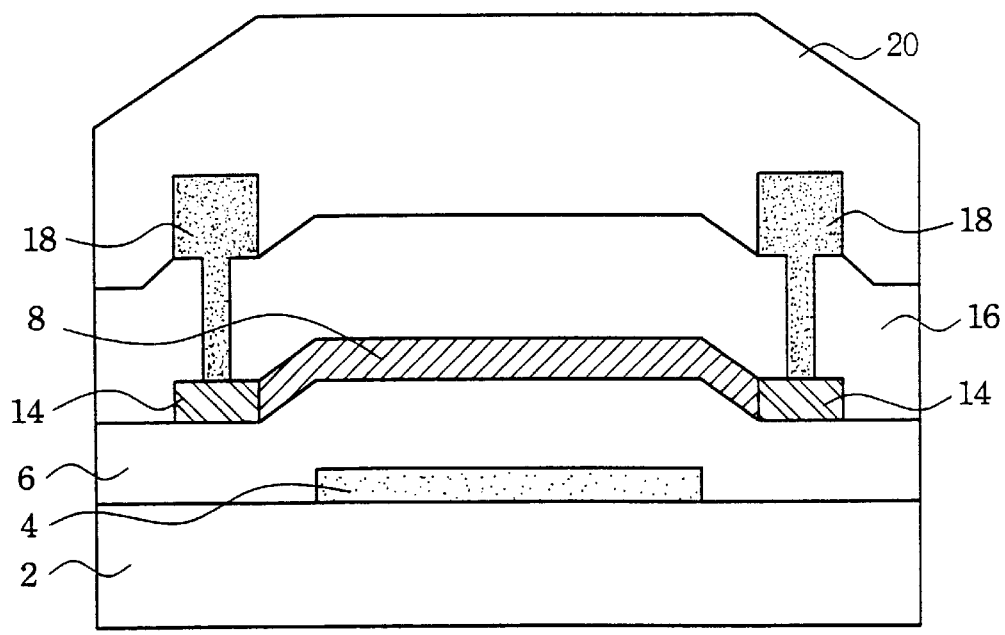
FIG. 10 is a cross sectional view of a semiconductor wafer illustrating the steps of forming source and drain and passivation layer in accordance with the present invention.

As shown in FIGS. 10, the amorphous silicon layer 8 is patterned. A further dielectric layer 16 for isolation is formed on the patterned amorphous silicon layer 8. Via holes are created by etching to expose a portion of the amorphous silicon layer 8. Next, a conductive layer 18 formed of metal, polysilicon or alloy are patterned on the dielectric layer 16 and in the via holes to contact with the amorphous silicon layer 8. The conductive layer 18 acts as the source and drain electrodes of the TFT. Referring to FIG. 10, subsequently, a passivation layer 20 formed of silicon nitride layer is deposited on the source and drain 18. Preferably, the thickness of the silicon nitride layer is about 3000 to 6000 angstroms. In a case, the silicon nitride layer can be amorphous silicon nitride having hydrogen dopant (a-$SiN_x$:H).

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a thin film transistor (TFT) on a glass substrate, said method comprising:

patterning a gate electrode on said glass substrate;

forming a gate isolation layer on said gate electrode layer;

forming an amorphous silicon layer on said gate isolation layer;

forming a first positive photoresist on said amorphous silicon layer;

performing a first backside exposure to said first positive photoresist by using said gate electrode as a mask;

removing exposed portions of said first positive photoresist;

baking said first positive photoresist to expand a lower portion of said first positive photoresist;

forming a second positive photoresist on said amorphous silicon layer and said first positive photoresist;

performing a second backside exposure to said second positive photoresist by using said gate electrode as a mask;

removing exposed portions of said second positive photoresist;

baking said second positive photoresist to expand a lower portion of said second positive photoresist;

forming doped regions in said amorphous silicon layer by using said second positive photoresist as a mask, said doped regions keeping a distance from said gate electrode;

removing said first and second positive photoresist;

forming an isolation layer on said amorphous silicon layer;

patterning a conductive layer on said isolation layer to contact with said doped regions via holes formed in said isolation layer; and forming a passivation layer on said conductive layer and said isolation layer.

2. The method of claim 1, further comprising annealing said amorphous silicon layer in a furnace after removing said first and second positive photoresist.

3. The method of claim 1, further comprising annealing said amorphous silicon layer by using Excimer laser after removing said first and second positive photoresist.

4. The method of claim 1, further comprising annealing said amorphous silicon layer in a furnace and by using Excimer laser after removing said first and second positive photoresist.

5. The method of claim 1, wherein said gate electrode is selected from a group consisting of chromium (Cr), tungsten (W), titanium (Ti), tantalum (Ta) molybdenum (Mo) and Cr/Al (chromium/aluminum).

6. The method of claim 1, wherein said conductive layer comprises metal.

7. The method of claim 1, wherein said conductive layer comprises alloy.

8. The method of claim 1, wherein said conductive layer comprises polysilicon.

9. The method of claim 1, wherein said first positive photoresist is baked at a temperature about 140 to 160 degrees centigrade.

10. The method of claim 1, wherein said first positive photoresist is baked for about 20 to 30 minutes.

11. The method of claim 1, wherein said second positive photoresist is baked at a temperature about 140 to 160 degrees centigrade.

12. The method of claim 1, wherein said second positive photoresist is baked for about 15 to 20 minutes.

13. The method of claim 1, wherein said doped regions are formed by ion implantation.

14. The method of claim 1, wherein said doped regions are formed by plasma treatment.

15. The method of claim 14, wherein said plasma treatment containing $PH_3$.

16. The method of claim 1, wherein said isolation layer comprises silicon nitride.

* * * * *